(12) United States Patent
Ojalvo et al.

(10) Patent No.: US 9,292,391 B2
(45) Date of Patent: Mar. 22, 2016

(54) INTERFACE CALIBRATION USING CONFIGURABLE ON-DIE TERMINATIONS

(71) Applicant: Apple Inc., Cupertino, CA (US)

(72) Inventors: Shai Ojalvo, Moshav Olesh (IL); Eyal Gurgi, Petah-Tikva (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 79 days.

(21) Appl. No.: 14/178,668

(22) Filed: Feb. 12, 2014

(65) Prior Publication Data

US 2015/0227440 A1    Aug. 13, 2015

(51) Int. Cl.
*H03K 19/00* (2006.01)
*G06F 11/16* (2006.01)

(52) U.S. Cl.
CPC ........ *G06F 11/1604* (2013.01); *H03K 19/0005* (2013.01)

(58) Field of Classification Search
CPC .................. H03K 19/0005; H03K 19/017545; G06F 14/4086
USPC .......................................... 326/21, 26, 27, 30
See application file for complete search history.

(56) References Cited

U.S. PATENT DOCUMENTS

| | | | |
|---|---|---|---|
| 7,486,104 B2 * | 2/2009 | Oh et al. | 326/30 |
| 8,041,865 B2 * | 10/2011 | Bruennert et al. | 710/104 |
| 2007/0080707 A1 * | 4/2007 | Brinkman et al. | 326/30 |
| 2011/0314200 A1 | 12/2011 | Wilson et al. | |
| 2012/0206165 A1 | 8/2012 | Ferolito et al. | |
| 2014/0002131 A1 * | 1/2014 | Shaeffer | 326/30 |
| 2014/0185374 A1 * | 7/2014 | Ramachandra | 365/185.2 |
| 2015/0009773 A1 * | 1/2015 | Grunzke | 365/230.08 |
| 2015/0098285 A1 * | 4/2015 | Huber et al. | 365/198 |
| 2015/0120986 A1 * | 4/2015 | Tuers et al. | 711/102 |

FOREIGN PATENT DOCUMENTS

WO     2012106131      8/2012

* cited by examiner

*Primary Examiner* — Don Le
(74) *Attorney, Agent, or Firm* — Meyertons, Hood, Kivlin, Kowert & Goetzel, P.C.

(57) ABSTRACT

A method includes communicating over an interface between a controller and multiple memory dies, which comprise respective on-die terminations (ODTs) that are each connectable to the interface by the controller. A plurality of termination settings are evaluated, each termination setting specifies a respective subset of the ODTs to be connected to the interface, so as to identify a preferred termination setting in which the communication quality with a given memory die meets a predefined criterion. Subsequent communication with the given memory die is performed while applying the preferred termination setting.

16 Claims, 3 Drawing Sheets

INTERFACE CALIBRATION USING CONFIGURABLE ON-DIE TERMINATIONS

FIELD OF THE INVENTION

The present invention relates generally to memory systems, and particularly to methods and systems for interface calibration using on-die termination.

BACKGROUND OF THE INVENTION

In many memory systems a memory controller or host communicates with memory dies over a bus or interface. To ensure reliable communication, the interface lines should be properly terminated at the receiving end. Termination techniques by which the termination is implemented on the die itself are referred to as On-Die Termination (ODT).

Various ODT schemes are known in the art. For example, PCT International Publication WO2012/106131, whose disclosure is incorporated herein by reference, describes local on-die termination controllers for effecting termination of a high-speed signaling links that simultaneously engage on-die termination structures within multiple integrated-circuit memory devices. The multiple memory devices are disposed on the same memory module, and/or within the same integrated-circuit package, and are coupled to the high-speed signaling link. A termination control bus is coupled to the memory devices on the module, and provides for peer-to-peer communication of termination control signals.

U.S. Patent Application Publication 2011/0314200, whose disclosure is incorporated herein by reference, describes a method by which the termination of a high-speed signaling link is effected by simultaneously engaging on-die termination structures within multiple integrated-circuit memory devices disposed on the same memory module, and/or within the same integrated-circuit package. The on-die termination structures are coupled to the high-speed signaling link.

U.S. Patent Application Publication 2012/0206165, whose disclosure is incorporated herein by reference, describes systems, methods, and apparatus, including computer program products, for providing termination resistance in a memory module. The apparatus comprises a plurality of memory circuits, an interface circuit operable to communicate with the plurality of the memory circuits and with a memory controller, and a transmission line, which electrically couples the interface circuit to the memory controller. The interface circuit is operable to terminate the transmission line with a single termination resistance that is selected in response to resistance-setting commands sent by the memory controller.

SUMMARY OF THE INVENTION

An embodiment of the present invention provides a method, including communicating over an interface between a controller and multiple memory dies, which includes respective on-die terminations (ODTs) that are each connectable to the interface by the controller. A plurality of termination settings are evaluated, each termination setting specifies a respective subset of the ODTs to be connected to the interface, so as to identify a preferred termination setting in which the communication quality with a given memory die meets a predefined criterion. Subsequent communication with the given memory die is performed while applying the preferred termination setting.

In some embodiments, the interface includes at least a control signal and an information signal, and evaluating the termination settings includes identifying the preferred termination setting in which the communication quality is acceptable over a maximum range of timing skews between the control signal and the information signal. In other embodiments, performing the subsequent communication includes configuring a timing skew parameter whose value is within the maximum range of the timing skews. In yet other embodiments, the preferred termination setting does not include an ODT of the given memory die.

In an embodiment, the predefined criterion requires detecting less than a predefined number of errors while retrieving stored data from the given memory die. In another embodiment, identifying the preferred termination setting includes identifying separate preferred termination settings for reading and for writing storage operations. In yet another embodiment, each of the memory dies further includes a memory output driver having configurable driver strength, and each termination setting further specifies a configuration of the driver strength of the memory output driver.

In some embodiments, the memory controller includes a controller ODT that is connectable to the interface, and each termination setting further specifies whether to connect the controller ODT to the interface. In other embodiments, the memory controller includes a controller output driver having configurable driver strength, and each termination setting further specifies a configuration of the driver strength of the controller output driver.

There is additionally provided, in accordance with an embodiment of the present invention, apparatus including multiple memory dies and a memory controller. The memory dies are configured to communicate over an interface and include respective on-die terminations (ODTs) that are each connectable to the interface. The memory controller is configured to communicate over the interface with the memory dies, to evaluate a plurality of termination settings, each termination setting specifies a respective subset of the ODTs to be connected to the interface, so as to identify a preferred termination setting in which communication quality with a given memory die meets a predefined criterion, and to perform subsequent communication with the given memory die while applying the preferred termination setting.

The present invention will be more fully understood from the following detailed description of the embodiments thereof, taken together with the drawings in which:

DETAILED DESCRIPTION OF EMBODIMENTS

Overview

Figure 1:
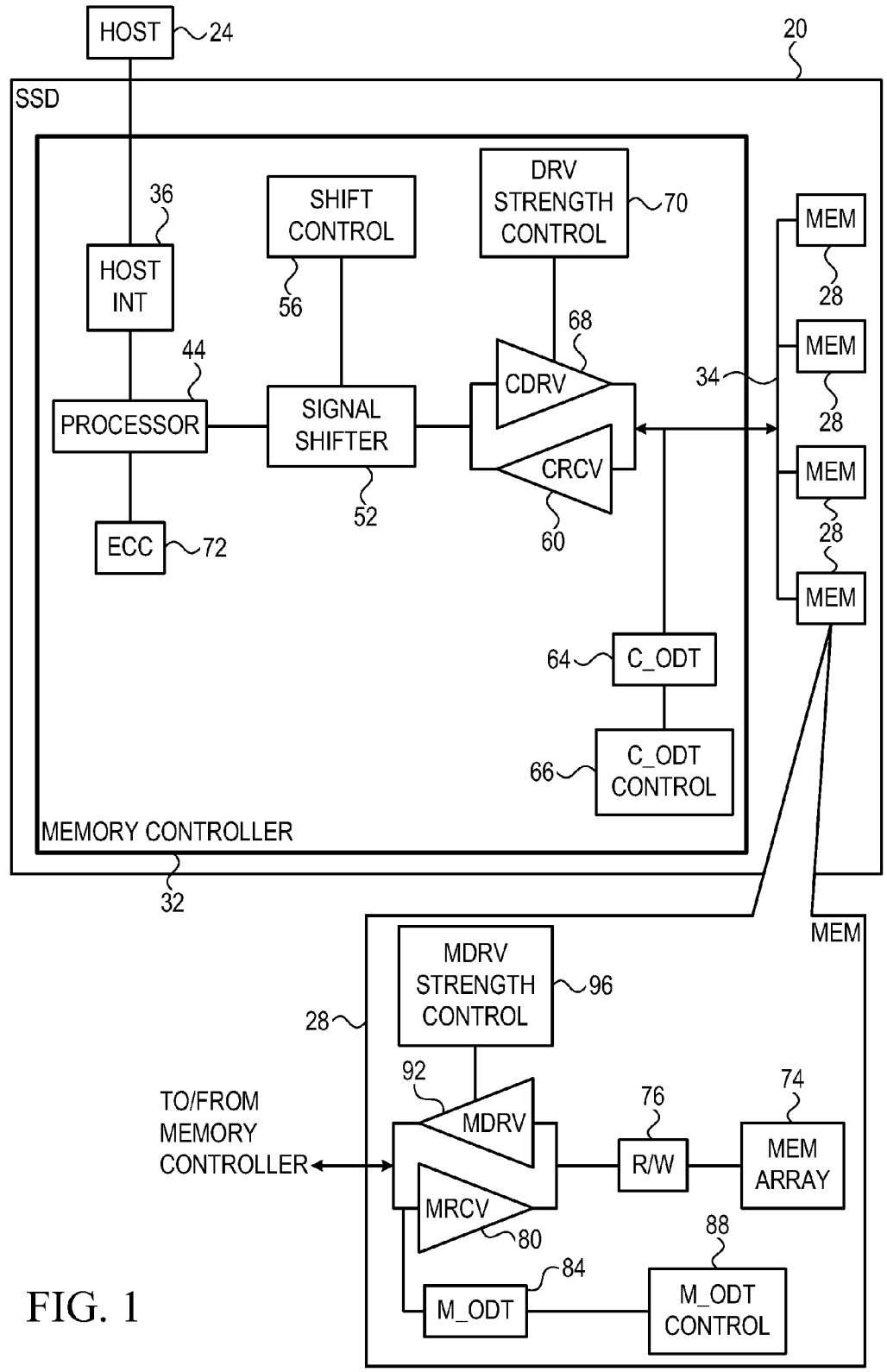
FIG. 1 is a block diagram that schematically illustrates a memory system, in accordance with an embodiment of the present invention.

In memory systems in which a memory controller communicates with multiple memory devices, communication is typically carried out by sending and receiving communication signals over an interface that connects between the memory controller and the memory devices. Communication signals (e.g., information and control signals) that travel along the interface lines may be distorted when the lines are not properly terminated, thereby degrading the communication reliability. Signal distortion may be reduced by terminating the interface lines with matched terminations. On-Die Termination (ODT) refers to implementing the terminations on the die itself.

When performing a storage operation such as writing or reading, the memory controller typically enables the memory device that is being accessed, and disables access to the other memory devices. In the description that follows, the term "target memory" refers to the memory device that is being accessed, and the term "non-target memory" refers to each of the memory devices that are disabled while the memory controller accesses the target memory.

In principle, when the memory controller communicates with a given target memory, the memory controller can terminate the interface by connecting only the ODT of the target memory when writing to the memory, and only the ODT of the memory controller when reading from the memory. In practice, however, the ODT impedance values typically have large variability due to manufacturing tolerance. As a result, impedance matching is in many cases suboptimal, causing the memory system to function reliably under narrower-than-possible operating conditions such as, temperature, power supply voltage and operating speed.

Embodiments of the present invention that are described herein provide improved methods and systems for calibrating the interface between the memory controller and the memory devices for reliable communication under a wide range of operating conditions. The disclosed techniques use the fact that, in practice, connecting only the ODT of the target memory device and disconnecting the ODTs of the non-target memory devices does not always provide the best achievable impedance match. In some cases, connecting a different subset of one or more ODTs, possibly including ODTs of non-target memory devices, provides a better match.

In the disclosed techniques, when communicating with a given target memory device, the memory controller activates the ODTs of one or more selected memory devices, not necessarily only the ODT of the target memory device. The memory controller may calibrate the interface (i.e., find the appropriate ODTs to be connected) during production, after a long period in which the memory system was not in use, upon a change in operating conditions, and/or occasionally during the lifetime of the memory system.

In some embodiments, the memory controller performs interface calibration by evaluating a plurality of termination settings, wherein each termination setting specifies a respective subset of the memory devices whose ODTs are to be connected to the interface. The memory controller identifies a preferred termination setting that causes the communication quality over the interface to meet a predefined criterion. The preferred termination setting may be different for reading and writing operations.

In some embodiments, the memory controller identifies a preferred termination setting in which the communication is acceptable over a maximum range of timing skews between information and control signals sent and received over the interface. In one embodiment, the memory controller regards the communication quality as acceptable when data retrieved from the memory is error free. In another embodiment, the memory controller protects the stored data with some error correcting code (ECC), and the communication over the interface is regarded acceptable if retrieving stored data results with less than a predefined number of errors.

The memory controller can define any suitable set of termination settings to be evaluated. For example, in some embodiments, each termination setting comprises a single ODT (of the target memory or of a non-target memory). In other embodiments, each termination setting may include multiple ODTs. In yet other embodiments, the termination setting can include the ODT of the target memory plus a suitable selection of one or more ODTs of non-target memories.

In some embodiments, each memory device comprises an output driver that delivers output signals toward the interface, and whose driver strength (i.e., the amplitude of the output signal) is configurable. In such embodiments, in addition to selecting the preferred ODT termination setting, the memory controller also selects a preferred driver strength value for the target memory to be set when reading the target memory.

In some embodiments, the memory controller comprises an ODT that can be connected to the interface under the control of the memory controller. The memory controller may additionally comprise an output driver with configurable driver strength (for output signals delivered, for example, when performing writing operations). In such embodiments, the termination setting may be extended to include the ODT setting of the memory controller, its driver strength configuration, or both.

In an embodiment, the ODT of the memory devices and/or the memory controller comprises multiple termination elements that may each be connected to or disconnected from the interface. Each termination setting in these embodiments determines which of the ODT terminating elements to connect to the interface in each of the ODTs.

The disclosed techniques enable optimal termination of the signals delivered over the interface between the memory controller and the memory devices, and therefore improved communication reliability over the interface. As a result, the memory system can operate over a wider range of varying conditions such as temperature, power supply voltage, and operating speed. The improved termination accuracy can also be used for increasing the data rate over the interface, and thus increasing storage throughput and reducing latency.

System Description

FIG. 1 is a block diagram that schematically illustrates a memory system 20, in accordance with an embodiment of the present invention. System 20 in FIG. 1 accepts data for storage from a host 24 and stores it in memory, and retrieves data from memory and provides it to the host. In the present example, system 20 comprises a Solid-State Drive (SSD) that stores data for a host computer. In alternative embodiments, however, system 20 may be used in any other suitable application and with any other suitable host, such as in computing devices, cellular phones or other communication terminals, removable memory modules, Secure Digital (SD) cards, Multi-Media Cards (MMC) and embedded MMC (eMMC), digital cameras, music and other media players and/or any other system or device in which data is stored and retrieved.

System 20 comprises multiple memory devices 28 and a memory controller 32 that share a common interface or I/O bus 34. Each memory device 28 comprises multiple memory cells (e.g., analog memory cells). System 20 stores data in the memory cells by programming the cells to assume respective memory states, which are also referred to as programming levels. The programming levels are selected from a finite set of possible levels, and each level corresponds to a certain nominal storage value. A simplified block diagram of the internal structure of memory device 28 is shown at the lower part of FIG. 1 and described further below.

Each memory device 28 may comprise a packaged device or an unpackaged semiconductor chip or die. A typical SSD may comprise a number of 4 GB devices. Generally, however, system 20 may comprise any suitable number of memory devices of any desired type and size.

Memory controller 32 of system 20 accepts data from host 24 and stores it in memory devices 28, and retrieves data from the memory devices and provides it to the host. Memory controller 32 comprises a host interface 36 for communicating with host 24, and a processor 44. Processor 44 processes the stored and retrieved data, and generally manages the operation of system 20. Among other tasks, processor 44 calibrates and controls On-Die Terminations (ODTs) for improving impedance matching in interface 34, as will be explained in detail below.

The memory controller communicates with memory devices 28 over interface (bus) 34 that typically comprises information (e.g., data and address) and control lines. The information and control signals should be optimally time aligned for maximal operating speed. The memory controller comprises a shifter module 52 that performs time shifting to align the time position of one or more of the signals of bus 34, based on skew configuration of a shift control unit 56.

In some embodiments, shifter 52 may comprise a concatenation of delay elements, and shift control unit 56 encodes which of the delay elements are incorporated to create the total time shift. In general however, any other suitable time shifter, such as configurable analog or digital time shifter may be used.

A receiver module 60 (denoted CRCV), amplifies and shapes input signals that memory controller 32 accepts over interface 34, and delivers the signals to shifter 52. To eliminate or minimize reflection effects, the received signals are terminated by an ODT unit 64 (denoted C_ODT), which is controlled by a C_ODT control unit 66. In some embodiments, C_ODT 64 comprises (per terminated signal) one or more passive elements such as resistors (e.g., with different impedance values), and control unit 66 controls the termination by connecting one or more of the passive elements to the respective interface line, or by disconnecting all of the passive elements. In alternative embodiments, C_ODT 64 comprises an active element whose impedance is determined based on analog or digital control signal provided by C_ODT control unit 66.

A driver module 68 of the memory controller (denoted C_DRV) transforms signals that memory controller 32 sends to the memory devices into output signals that are suitable for delivery over interface 34. Driver 68 typically shapes the signals and determines their output amplitude. The amplitude at the output of driver 68 is also referred to as the output "driver strength" and is determined, per output signal, by a driver strength control unit 70.

In some embodiments, controller 32 encodes the stored data with an Error Correction Code (ECC). In these embodiments, controller 32 comprises an ECC unit 72, which encodes the data stored in devices 28 and decodes the ECC of data retrieved from devices 28.

The lower part of FIG. 1 shows a simplified block diagram of the internal structure of memory device 28, in accordance with an embodiment of the present invention. The memory device connects to bus 34 that carries information and control signals to and from memory controller 32. Memory device 28 comprises a memory array 74 that comprises multiple memory cells, and a Read/Write (R/W) unit 76, which writes data values into the memory cells, and reads data values from the memory cells.

A memory receiver module MCRV 80 amplifies and shapes input signals and delivers them to R/W unit 76. A memory termination module 84 (denoted M_ODT) terminates the input signals under the control of control unit 88 (denoted M_ODT). The functionality of M_ODT 84 and M_ODT control unit 88 is similar to the respective functionality of C_ODT 64 and C_ODT 66 described above. To set the configuration of M_ODT 84 via M_ODT control unit 88, the memory controller sends a dedicated ODT configuration command to the respective memory device.

A memory driver module MRDV 92 transforms signals generated by R/W unit 76 into memory output signals to be delivered over interface 34 to the memory controller. The output driver strength of MRDV 92 is controlled by a memory driver strength control unit 96. To set the configuration of the driver strength of MDRV 92, the memory controller sends a dedicated driver strength configuration command to the respective memory device.

Memory controller 32, and in particular processor 44, may be implemented in hardware (e.g., state machine or other logic). Alternatively, the memory controller may comprise a suitable Central Processing Unit (CPU) or a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are integrated on separate semiconductor dies in a single Multi-Chip Package (MCP) or System on Chip (SoC), and are interconnected by an internal bus. In alternative embodiments, however, the memory devices and the memory controller may be implemented as separate Integrated Circuits (ICs). Further alternatively, some or all of the memory controller circuitry may reside on the same die on which one or more of the memory devices are disposed. Further alternatively, some or all of the functionality of memory controller 32 can be implemented in software and carried out by a processor or other element of the host system, or by any other type of memory controller. In some embodiments, host 24 and Memory controller 32 may be fabricated on the same die, or on separate dies in the same device package.

Interface Calibration with Configurable ODT Setting

In some embodiments, the memory controller performs interface calibration to allow high quality communication (e.g., resulting in error free operation) over production variations and changing operating conditions such as different temperatures, power supply voltages, and operating speeds. For example, in timing calibration the memory controller scans the timing shift values that are available for shifter 52 by shift control unit 56, and for each shift value, the memory controller writes data to the target memory and reads the data back to verify whether it is erroneous.

While scanning the shift values, the memory controller marks the maximal and minimal shift values that create a continuous shift range over which the data is read with no errors, or with less than a predefined number of errors. This range is also referred to herein as the "operable shift range". The memory controller then configures shifter 52 to some in-range value (e.g., the middle or median shift value) within the operable shift range. In general, larger operable shift range enables memory system 20 to operate over a wider range of operating conditions.

In an embodiment, memory controller 32 encodes the stored data with an error correcting code using ECC 72. In this embodiment, the memory controller allows for errors in the data retrieved from the memory up to a certain tolerable number that is below the error correcting ability of ECC 72.

Methods for calibrating the timing of the interface signals are described, for example, in U.S. patent application Ser. No. 13/939,588, filed Jul. 11, 2013, which is assigned to the assignee of the present patent application and whose disclosure is incorporated herein by reference. Alternatively, any other suitable method can be used.

The memory controller typically conducts separate calibration procedures for reading and writing operations. When calibrating read operations, the memory controller can write at a low rate to guarantee no writing errors. On the other hand, when calibrating write operations, the memory controller can read at a low rate to guarantee no reading errors.

In the embodiments described below, the memory controller calibrates the interface by connecting one or more ODTs of respective memory devices to the interface. A subset of one or more ODTs that are to be connected to the interface is referred to herein as a "termination setting." As described further below, each termination setting may include the ODTs of the target memory, one or more non-target memories, and/or the memory controller.

When calibrating the interface for a given target memory, the memory controller repeats the timing calibration described above for different termination settings (e.g., out of a predefined plurality of termination settings), and records the respective operable shift range for each termination setting. The memory controller searches the plurality of termination settings to find the preferred termination setting for which the operable shift range is maximal.

In some of the disclosed embodiments, the memory controller additionally repeats the timing calibration for different selections of driver strength values in the output driver of the target memory or memory controller. In such embodiments the termination setting includes the respective driver strength setting.

Figure 2:
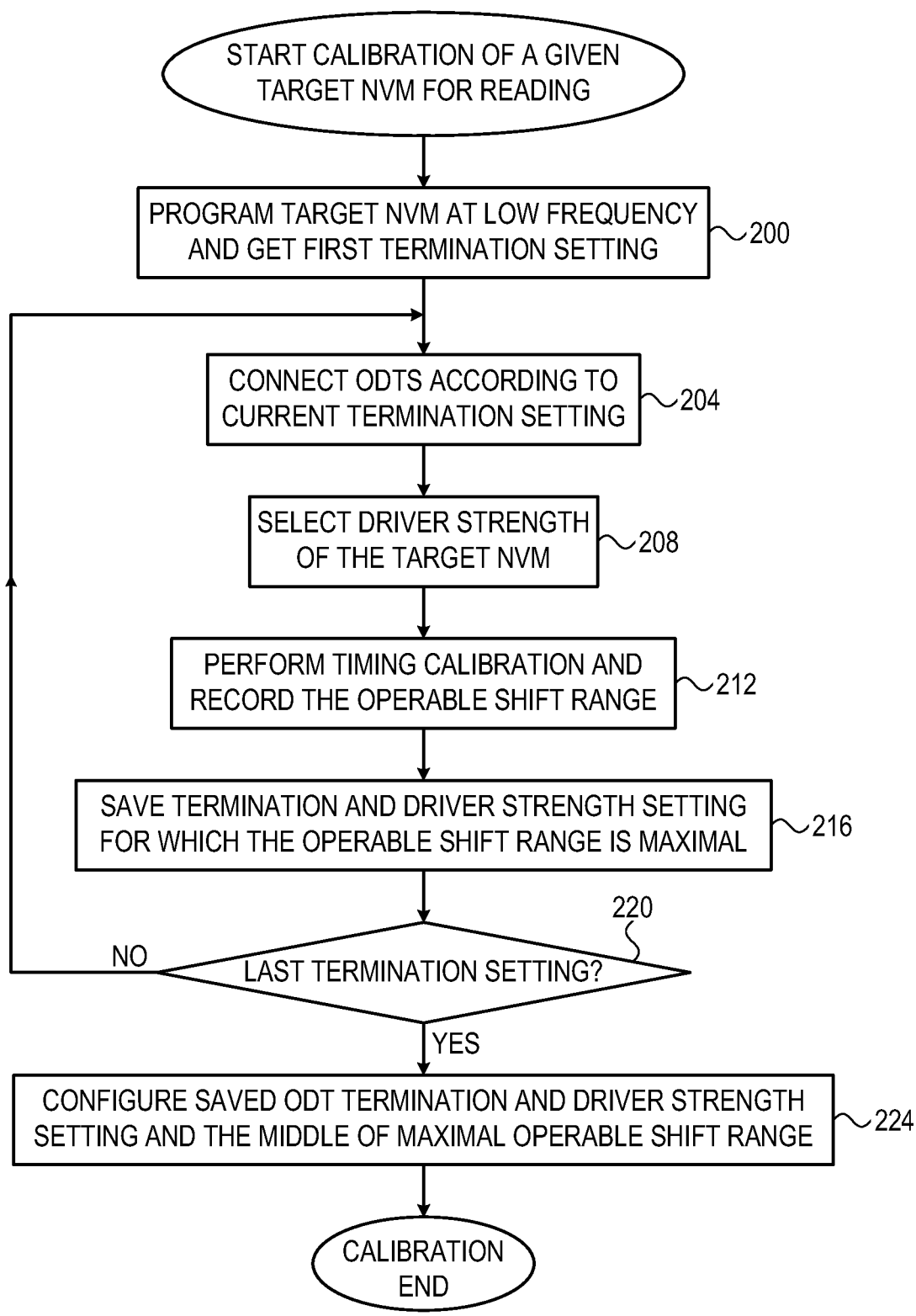
FIG. 2 is a flow chart that schematically illustrates a method for calibrating an interface for read operations, in accordance with an embodiment of the present invention.

FIG. 2 is a flow chart that schematically illustrates a method for interface calibration for read operations, in accordance with an embodiment of the present invention. The method is described for one target memory, and is typically repeated for each target memory. In the description of the method we assume that the memory controller has access to a predefined group of termination settings.

For example, in some embodiments each termination setting specifies to connect a single ODT, either of the target or non-target memory. In other embodiments, each termination setting specifies to connect the ODT of a single non-target memory. Thus for a system that comprises N memory devices the group of termination settings comprises one target memory termination setting, plus N−1 different non-target memory termination settings. In yet another embodiment, each termination setting specifies connection of the ODT of the target memory, plus optionally one or more additional non-target ODTs. Further alternatively, any other suitable set of termination settings may be used.

The method begins with memory controller 32 programming the target memory with testing data at a programming step 200. Memory controller 32 can use any suitable testing data as known in the art. The memory controller programs the testing data at a low rate to guarantee that no programming errors occur in the direction from the memory controller to the target memory. Further at step 200, the memory controller gets a first termination setting out of the predefined group of termination settings. For example, the group of termination settings may comprises an ordered list, and the memory controller gets the first termination setting in the list. The memory controller then manages an iterative calibration process over the predefined group of termination settings as described below.

At a read ODT setting step 204, the memory controller connects the ODTs of the memory devices according to the current termination setting. At step 204, since the method calibrates reading operations, the ODTs of the target memory and the memory controller are typically disconnected.

In an embodiment, M_ODT unit 84 comprises multiple termination elements. In such embodiments, the setting at step 204 includes connecting one or more of the internal ODT termination elements to the interface.

At a driver strength selection step 208, the memory controller selects a driver strength configuration for the target memory. The combined selection at steps 204 and 208 can be viewed as searching in a two dimensional space in which one dimension corresponds to the ODT termination setting, and the other dimension corresponds to the driver strength configuration of the target memory. Alternatively, instead of scanning multiple driver strength values, the driver strength may be set to a suitable default value.

At a read timing calibration step 212, memory controller 32 performs timing calibration as described above. The programming phase, however, may be omitted since the testing data was already programmed at step 200 above. The result at step 212 is the operable shift range of shifter 52 that corresponds to the ODT termination and driver strength settings in the current iteration.

At a range saving step 216, memory controller compares the operable shift range from step 212 to a previously saved operable shift range. When the range result at step 212 is larger than the saved range, the memory controller replaces the saved range with the larger range (from step 212) and additionally stores the respective ODT termination and driver strength settings. Note that in the first iteration the memory controller simply stores the operable shift range of step 212 and corresponding ODT termination and driver strength setting.

At an iteration checking step 220, the memory controller checks whether there are any other ODT termination and driver strength settings to be tested. If there are additional settings to be tested, the memory controller loops back to step 204 to execute the next iteration. Otherwise, memory controller 32 proceeds to a read configuration step 224. At step 224 the memory controller configures system 20 using the last saved (at step 216) ODT termination and driver strength configurations. Additionally, the memory controller configures shifter 52 to the middle shift value of the corresponding maximal operable shift range. Alternatively, the memory controller configures shifter 52 to any other suitable shift value within the maximal operable shift range. Following step 224 the method terminates.

Figure 3:
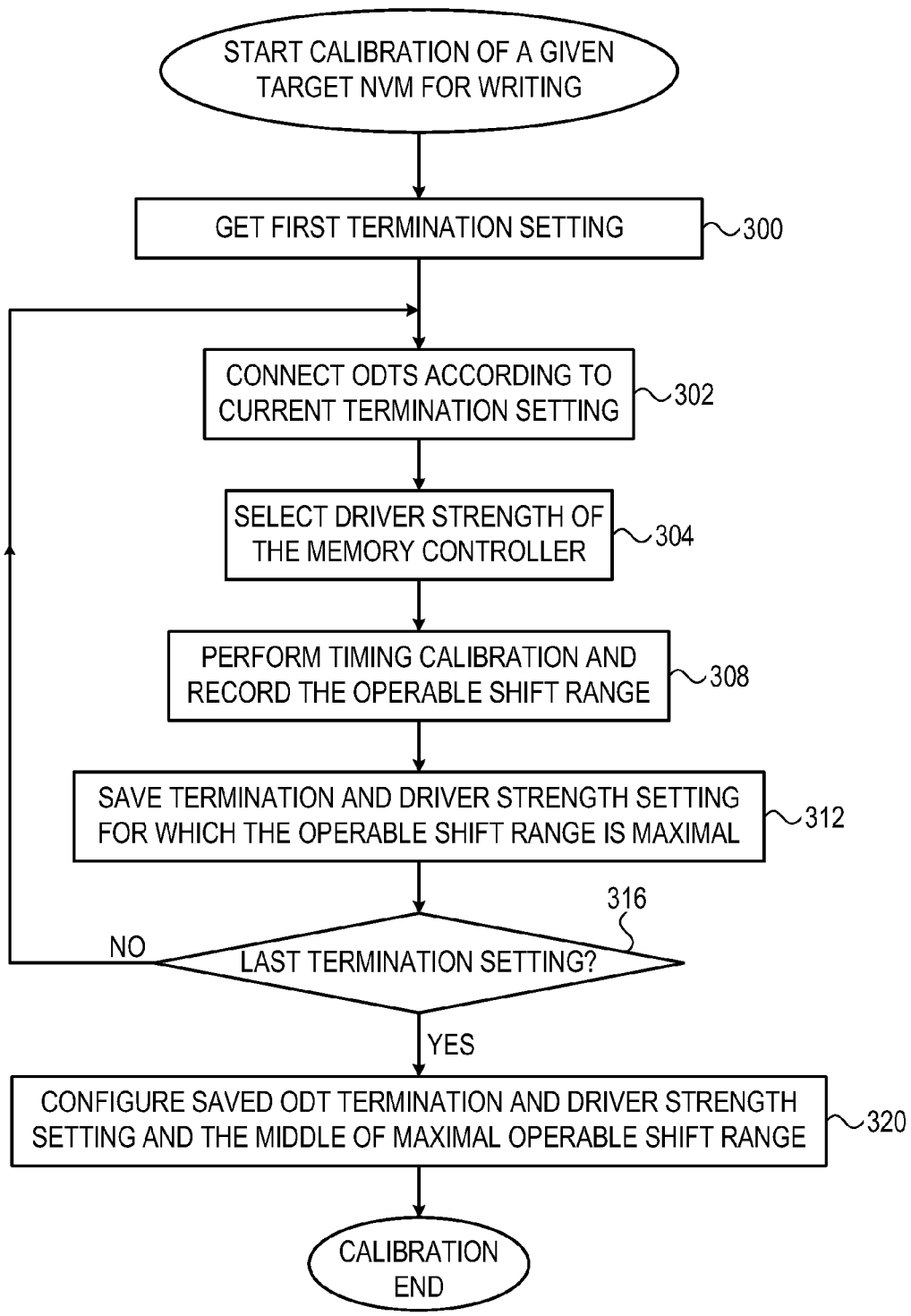
FIG. 3 is a flow chart that schematically illustrates a method for calibrating an interface for write operations, in accordance with an embodiment of the present invention.

FIG. 3 is a flow chart that schematically illustrates a method for interface calibration for write operations, in accordance with an embodiment of the present invention. The method begins with memory controller 32 getting a first termination setting out of the predefined group of termination settings, at a first setting getting step 300. At a write ODT termination setting step 302, the memory controller connects ODTs according to the current termination setting. At step 302, the ODT of the memory controller is typically disconnected, since the method calibrates writing operations. At a write driver strength selection step 304, memory controller 32 configures the driver strength of CDRV 68 (via driver strength control unit 70).

At a write timing calibration step 308, memory controller 32 performs timing calibration as described above. During the timing calibration, memory controller writes data at the maximal rate and reads the programmed data at a low rate to guarantee no reading errors. The outcome of step 308 is the operable shift range of shifter 52 that corresponds to the ODT termination and driver strength settings in the current iteration.

At a write saving step 312, memory controller 32 updates and saves the maximal operable shift range that results at step 308 during the calibration iterations.

At a write iteration checking step 316, memory controller 32 checks whether all the ODT termination and driver strength settings have been already tested. If the result at step 316 is negative, the memory controller loops back to step 302 to execute the next iteration. Otherwise, the memory controller connects the ODT in the memory devices and configures the driver strength of CDRV 68 according to the configuration that was last saved at step 312, at a write configuration step 320. Additionally, at step 320 the memory controller configures shifter 52 to the middle shift value of the maximal operable shift rage, or to any other suitable shift value within that range. Following step 320, the method terminates.

The configurations in the methods described above are exemplary configurations and other suitable configurations can also be used. For example, although in the method of FIG. 2, while reading the testing data, the ODT of the memory controller is connected and ODT of the target memory is disconnected, and in the method of FIG. 3, while writing the testing data, the ODT of the memory controller is disconnected and the ODT of the target memory is connected, in alternative embodiments, any other termination setting of the ODTs in the memory controller and target memory can also be used.

In the disclosed embodiments, the termination settings include ODTs of the memory devices and the memory controller. In alternative embodiments, in which additional devices or peripheral components that have ODTs share the same interface as the memory controller and the memory devices, the termination selection can include the ODTs of the peripheral components as well.

Although in the methods described above the memory controller searches for optimal configuration of ODTs termination, driver strength, and time shift, the methods can be alternatively or additionally search over any other parameters.

Although the embodiments described herein mainly address ODT in memory devices that are controlled over an interface by a memory controller, the methods and systems described herein can also be used in other applications, such as in any system in which calibrating the communication interface between one die and multiple other dies is based on ODT.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
communicating over an interface between a controller and multiple memory dies, which comprise respective on-die terminations (ODTs) that are each connectable to the interface by the controller;
evaluating a plurality of termination settings, each termination setting specifying a respective subset of the ODTs to be connected to the interface, so as to identify a preferred termination setting in which communication quality with a given memory die meets a predefined criterion; and
performing subsequent communication with the given memory die while applying the preferred termination setting;
wherein the predefined criterion requires detecting less than a predefined number of errors while retrieving stored data from the given memory die.

2. The method according to claim 1, wherein the interface comprises at least a control signal and an information signal, and wherein evaluating the termination settings comprises identifying the preferred termination setting in which the communication quality is acceptable over a maximum range of timing skews between the control signal and the information signal.

3. The method according to claim 2, wherein performing the subsequent communication comprises configuring a timing skew parameter whose value is within the maximum range of the timing skews.

4. The method according to claim 1, wherein the preferred termination setting does not include an ODT of the given memory die.

5. The method according to claim 1, wherein identifying the preferred termination setting comprises identifying separate preferred termination settings for reading and for writing storage operations.

6. The method according to claim 1, wherein each of the memory dies further comprises a memory output driver having configurable driver strength, and wherein each termination setting further specifies a configuration of the driver strength of the memory output driver.

7. The method according to claim 1, wherein the memory controller comprises a controller ODT that is connectable to the interface, and wherein each termination setting further specifies whether to connect the controller ODT to the interface.

8. The method according to claim 1, wherein the memory controller comprises a controller output driver having configurable driver strength, and wherein each termination setting further specifies a configuration of the driver strength of the controller output driver.

9. An apparatus, comprising:
multiple memory dies, which are configured to communicate over an interface and comprise respective on-die terminations (ODTs) that are each connectable to the interface; and
a memory controller, which is configured to communicate over the interface with the memory dies, to evaluate a plurality of termination settings, each termination setting specifying a respective subset of the ODTs to be connected to the interface, so as to identify a preferred termination setting in which communication quality with a given memory die meets a predefined criterion, and to perform subsequent communication with the given memory die while applying the preferred termination setting;

wherein the predefined criterion requires detecting less than a predefined number of errors while retrieving stored data from the given memory die.

10. The apparatus according to claim 9, wherein the interface comprises at least a control signal and an information signal, and wherein the memory controller is configured to identify the preferred termination setting in which the communication quality is acceptable over a maximum range of timing skews between the control signal and the information signal.

11. The apparatus according to claim 10, wherein the memory controller is configured to set a timing skew parameter whose value is within the maximum range of the timing skews.

12. The apparatus according to claim 9, wherein the preferred termination setting does not include an ODT of the given memory die.

13. The apparatus according to claim 9, wherein the memory controller is configured to identify separate preferred termination settings for reading and for writing storage operations.

14. The apparatus according to claim 9, wherein each of the memory dies further comprises a memory output driver having configurable driver strength, and wherein each termination setting further specifies a configuration of the driver strength of the memory output driver.

15. The apparatus according to claim 9, wherein the memory controller comprises a controller ODT that is connectable to the interface, and wherein each termination setting further specifies whether to connect the controller ODT to the interface.

16. The apparatus according to claim 9, wherein the memory controller comprises a controller output driver having configurable driver strength, and wherein each termination setting further specifies a configuration of the driver strength of the controller output driver.

* * * * *